(12) United States Patent
Alers et al.

(10) Patent No.: US 6,750,495 B1
(45) Date of Patent: Jun. 15, 2004

(54) DAMASCENE CAPACITORS FOR INTEGRATED CIRCUITS

(75) Inventors: Glenn B. Alers, Santa Cruz, CA (US); Tseng-Chung Lee, New York, NY (US); Helen Louise Maynard, Somerset, NJ (US); Daniel Joseph Vitkavage, Winter Garden, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/310,388

(22) Filed: May 12, 1999

(51) Int. Cl.[7] .................. H01L 27/108; H01L 29/76
(52) U.S. Cl. .................. 257/296; 257/301; 257/310
(58) Field of Search ................ 257/296, 301, 257/303, 302, 304, 310; 438/386

(56) References Cited

U.S. PATENT DOCUMENTS

| 5,457,063 | A |   | 10/1995 | Park |         |
|-----------|---|---|---------|------|---------|
| 5,716,883 | A |   | 2/1998  | Tseng |        |
| 5,888,877 | A | * | 3/1999  | Dennison et al. | 438/386 |
| 5,952,687 | A | * | 9/1999  | Kawakubo et al. | 257/296 |
| 6,017,790 | A | * | 1/2000  | Liou et al. | 438/240 |
| 6,057,571 | A | * | 5/2000  | Miller et al. | 257/296 |

FOREIGN PATENT DOCUMENTS

| EP | 1020905 A1 | 7/2000 |
| GB | 2339962 A  | 2/2000 |
| GB | 2344218 A  | 5/2000 |

* cited by examiner

Primary Examiner—Long Pham
Assistant Examiner—Ginette Peralta

(57) ABSTRACT

A capacitor structure is formed in a window in a dielectric layer of an integrated circuit. The lower electrode (or plate) is disposed on a portion side surface of the cavity but not on the top surface of the dielectric. A layer of dielectric material is disposed on the lower electrode and upon the top surface of the integrated circuit dielectric. Finally, an upper electrode (or plate) is disposed on the layer of dielectric material. Because the lower electrode is removed from a portion of the cavity sidewall and top surface of the dielectric shorting problems which could result during planarization are avoided. A technique for fabricating an integrated circuit (IC) for use in multi-level structures is also disclosed. The technique is readily incorporated into standard multi-level processing techniques. After a window is opened in the particular dielectric layer of the IC, a conductive layer is deposited in the window and forms the lower plate of a capacitor. The lower plate is then etched so that it is removed from a portion of the sidewalls and from the top surface of the dielectric layer. After the lower electrode is etched, a dielectric material is disposed in the cavity and on the top surface of the dielectric layer. A second layer of conductor is disposed on top of the dielectric material layer, thus completing the capacitor structure.

7 Claims, 3 Drawing Sheets

DAMASCENE CAPACITORS FOR INTEGRATED CIRCUITS

FIELD OF THE INVENTION

The present invention relates to a capacitor structure and its method of fabrication for use in integrated circuits.

BACKGROUND OF THE INVENTION

Dynamic random access memory (DRAM) relates to electronic devices consisting of cells which can retain information only for a limited time before they must be read and refreshed at periodic intervals. A typical DRAM cell consists of at least one transistor and a storage capacitor. In general, the integrated circuit used for DRAMs consists of metal oxide semiconductor (MOS) and particularly complementary MOS structures (CMOS) as the transistor component. Recently, the capacity of such DRAM structures has evolved from one megabit to on the order of one gigabit. This increase in memory has required the evolution of gate feature sizes on the order of 1.25 microns down to on the order of 0.25 microns or smaller. As the DRAM capacity requirements are increased, the requirements placed on the capacitors are increased as well. Not only is there a requirement for increased capacitance, there is also a requirement for decreased capacitor area. Accordingly, development efforts have been focused on materials and structures to meet this need.

To minimize interconnection resistance and to maximize the use of valuable chip area, advanced VLSI and ULSI logic integrated semiconductor circuits use multi-level wiring line structures for interconnecting regions within the devices and for interconnecting one or more devices within the integrated circuit. Multi-level metallization provides greater flexibility in circuit design, a reduction in die size and, thereby, a reduction in chip cost. In fabricating such structures, the conventional approach is to form lower level wiring lines (or interconnect structures) and then form one or more upper level wiring lines interconnected with the first level wiring lines. A first level interconnect structure may be, in contact with the doped region within the substrate of an integrated circuit device (for example the source or drain of a typical MOSFET). One or more interconnections are typically formed between the first level interconnect and other portions of the integrated circuit device or to structures external to the integrated circuit device. This is accomplished through the second and subsequent levels of wiring lines. An example of the multi-layer interconnect structure used in conventional VLSI and ULSI structures can be seen in FIG. 7. Conductive vias, shown generally at 701 are used to make the connection from one level to another. As is shown in FIG. 7, metal layer M-1 at the first level is connected to the source (S) 702 formed in the substrate layer of the integrated circuit. This metal layer M-1 is used to make electrical connections at level one as well as at higher levels using the via structure as shown.

An embedded DRAM structure adds integrated capacitors to the logic transistors to add high density memory cells to the circuit. These integrated capacitors can be connected to the source metallization of the MOS device to form the memory cell. Conventional DRAM capacitors often have a layer of polysilicon as the bottom electrode; a layer of silicon dioxide or silicon nitride as the insulator; and a top metal layer forming the top electrode. Such a structure is generally not compatible with embedded DRAM technology because of the added complexity of the poly-Si capacitors and the high temperatures required to grow the silicon oxide/nitride layer. For example, the aluminum metal layers used as interconnects in the multi-layer structure can be adversely affected by the relatively high temperatures used in the deposition of polysilicon. Furthermore, the use of polysilicon as an electrode can have deleterious affects on the electrical characteristics of the device. To this end, it is known to use tantalum pentoxide as the dielectric of the capacitor because of its a higher dielectric constant compared to silicon dioxide or silicon nitride. During the chemical vapor deposition used to form the tantalum pentoxide, a necessary layer of silicon dioxide is formed between the polysilicon layer and the tantalum pentoxide layer to prevent reduction of the tantalum pentoxide, and consequential leakage current. As can be appreciated, this layer of silicon dioxide is not desired in a capacitor, as it tends to adversely impact the capacitance of the capacitor. Accordingly, there is a need for a capacitor structure in DRAM's, which avoids the use of polysilicon electrodes.

Trench capacitor structures are used in multi-layer integrated circuit (IC) structures to increase capacitance density compared to planar capacitors. While trench capacitors have enabled more efficient use of valuable chip real estate, applicants have recognized that known trench capacitor structures may not be adaptable to multi-layer fabrication techniques. In particular, planarization plays an important role in the fabrication of multi-layer integrated circuits. To this end, during the process of circuit fabrication, various growth and deposition techniques used to form insulating and conducting layers can result in an increasingly non-planar structure, which presents two major problems. The first problem is one of maintaining step coverage without breaks in the continuity of fine line structures. The second problem is a reduction in the optical resolution and therefore reduction in the ability to image fine-line patterns over the wafer structure. Accordingly, polishing techniques are used to maintain planarity at each level in a multi-level structure. One technique which has become widely embraced for planarization is chemical mechanical polishing (CMP). Such a polishing step would be utilized, for example after the fabrication of the capacitor in order to maintain a planar topology. After the fabrication of the capacitor, a CMP or other planarization step would be employed and subsequent deposition of metal and dielectric layers for the next level of the multi-level structure would be carried out. However, in known trench capacitor structures, CMP and other planarization techniques can have deleterious effects on the capacitor, for example shorting of the plates (electrodes).

Accordingly, the capacitor structures discussed above are not readily amenable to the processing techniques used in ULSI fabrication of multi-layer structures. What is needed is a capacitor structure which improves the capacitance density while being readily adaptable to standard/low temperature processing techniques and one which is compatible with chemical mechanical polishing used in multi-layer structures to maintain a desired level of planarity.

SUMMARY OF THE INVENTION

A capacitor structure is formed in an opening in a dielectric layer of an integrated circuit. The lower electrode (or plate) extends up at least a portion of the side surface(s) of the opening, but not onto the top surface of the dielectric. A layer of dielectric material is disposed on the lower electrode and upon the top surface of the integrated circuit dielectric. Finally, an upper electrode (or plate) is disposed on the layer of dielectric material. Because the lower electrode is removed from the top surface of the dielectric there is no overlap of the upper and lower electrodes along the top surface of the dielectric, thus avoiding shorting problems which could result during planarization.

DETAILED DESCRIPTION OF THE INVENTION

Figure 1:
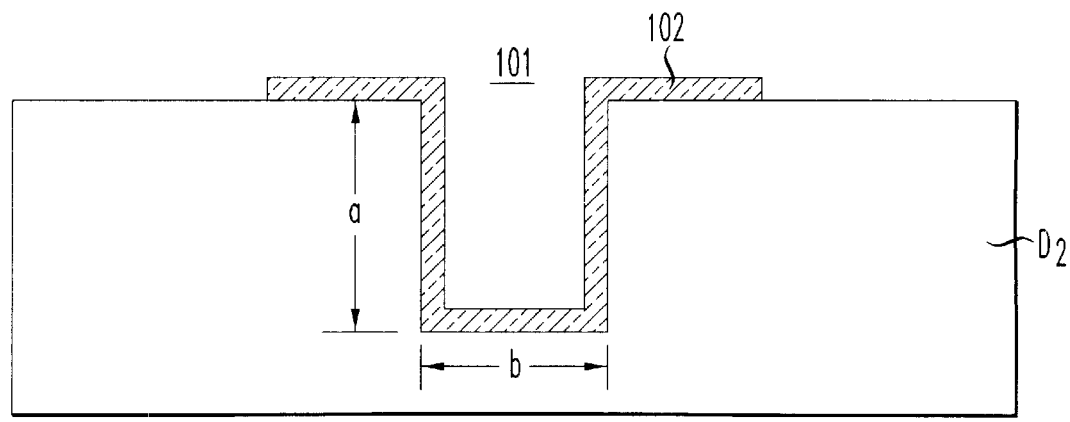
FIG. 1 is a cross-sectional view of a step in an exemplary capacitor fabrication process sequence, after deposition of the lower electrode in the opening in a dielectric layer of the IC.
Figure 2:
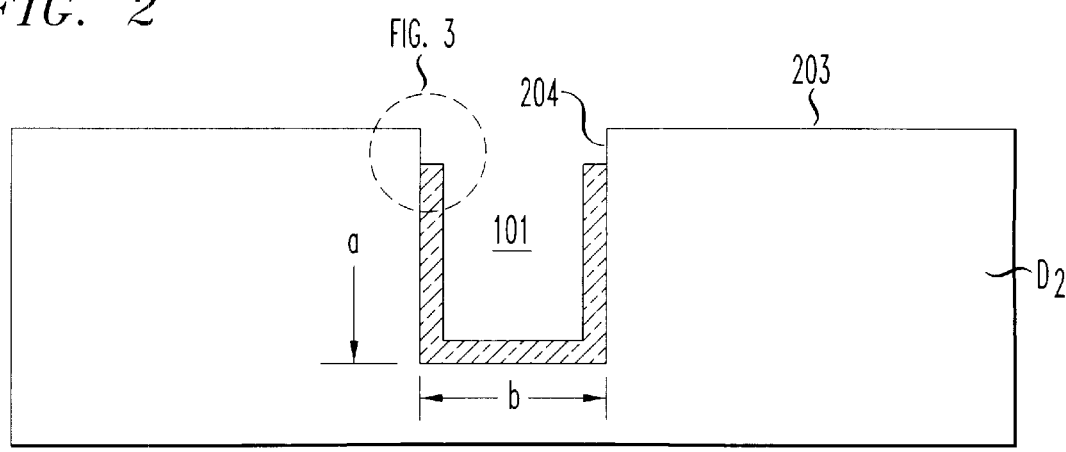
FIG. 2 is a cross-sectional view showing the etching of the lower plate of the exemplary capacitor of FIG. 1.
Figure 3:
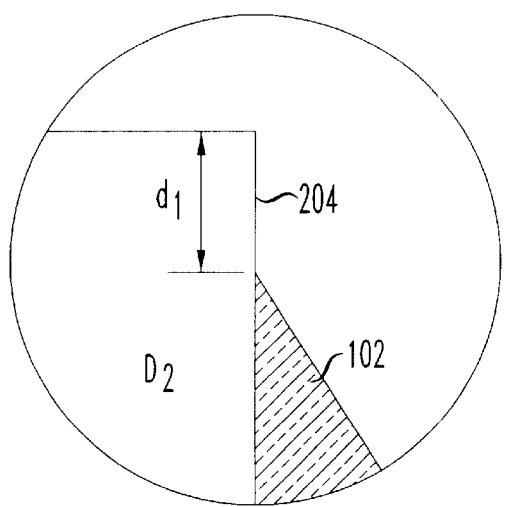
FIG. 3 is an enlarged cross-sectional view showing the etchback of the lower electrode in the exemplary capacitor structure.
Figure 4:
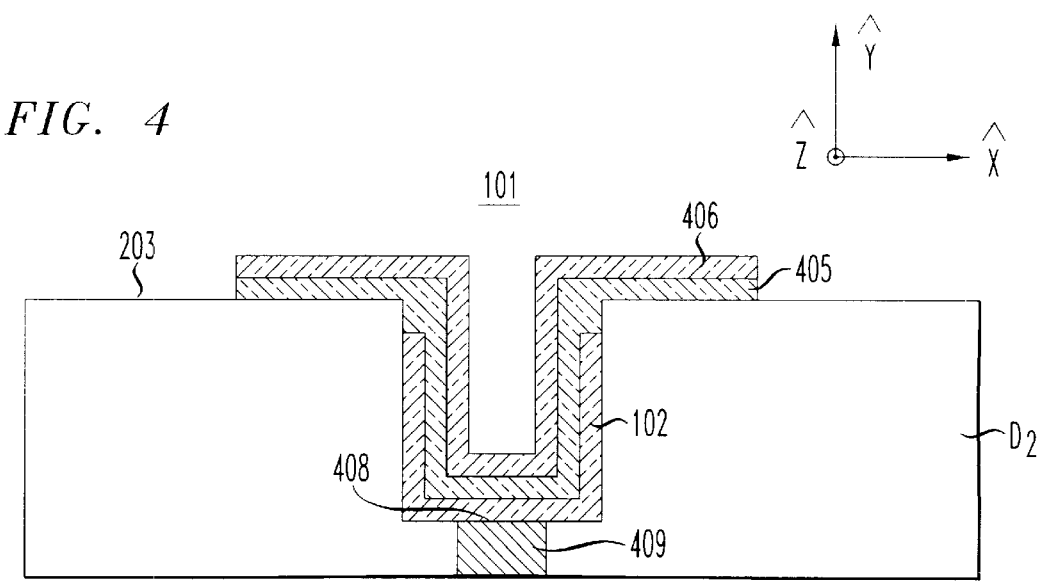
FIG. 4 is a cross-sectional view showing the exemplary capacitor structure after the deposition of the oxide and upper electrode.
Figure 5:
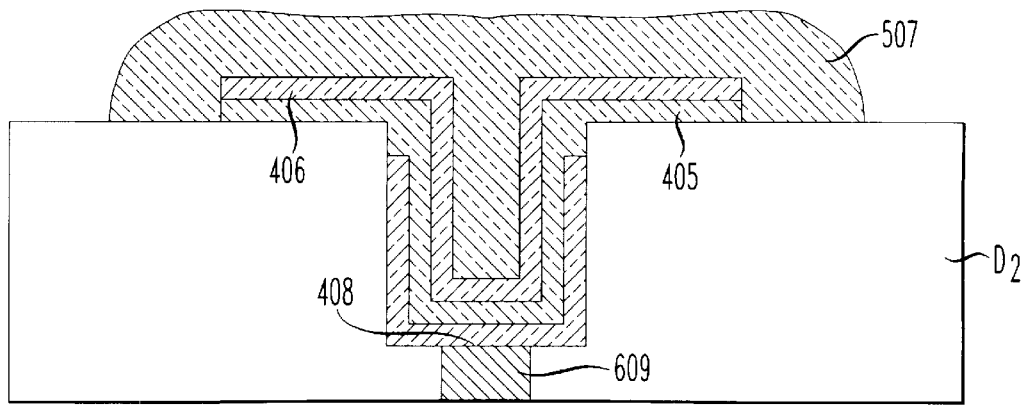
FIG. 5 is a cross-sectional view showing the exemplary capacitor after the back filling of a suitable conductor, for example tungsten.

The invention may be generally understood by referring to FIGS. 1–4, which are cross-sectional views of the exemplary fabrication sequence. An opening shown generally at 101 is opened in the layer $D_2$ by conventional patterning such as by photoresist (PR), masking and subsequent etching. The layer $D_2$ is exemplary a dielectric, but could be other materials within the purview of the artisan of ordinary skill. Thereafter, the lower capacitor plate 102, for example titanium nitride (TiN), is deposited, exemplary by chemical vapor deposition (CVD). After the deposition of the lower plate 102 is complete, an isotropic etch is carried out to remove the lower plate 102 from the top surface of the dielectric 203 and, exemplary, although not necessarily, from a portion of the sidewall(s) of opening 101. In particular, as shown in FIGS. 2 and 3, the plate 102 is removed from the top surface of the dielectric 203, and in the exemplary embodiment, from a portion of the sidewall(s) of the cavity shown at 204. Shown in more detail in FIG. 3, the depth of the etchback of the lower plate 102 is shown generally as $d_1$. This depth $d_1$ is on the order of 0.1–0.2 microns. The removal of this layer is important to the invention of the present disclosure as will be elaborated upon later presently. Thereafter the capacitor dielectric material 405 and the upper plate 406 are deposited as shown in FIG. 4, completing the capacitor.

As discussed above, the opening 101 is made in the dielectric layer of the IC by standard technique. It is of interest to note that the basic structure of the Figures is merely exemplary and not intended to be limiting. To this end, the opening 101 can be made to enable the connection to a lower metal via (also referred to as a plug 409 herein) from the bottom(as in FIG. 4, for example). In this case, the opening is referred to herein as a window. Alternatively, contact to the lower electrode can be from the top or side (not shown in the Figures). In this case, the opening is referred to herein as a cavity. The process used to effect the etch of the first lower electrode layer 102 is carried out preferably in one of two ways; although, other techniques within the purview of one of ordinary skill in the art can be used to effect the selective removal of a portion of the lower electrode 102. Finally, whether a cavity or window is made in the dielectric layer, the geometrical shape can vary, as would be readily understood by one of ordinary skill in the art. The opening can be of elliptical cross-section having varying eccentricity. In this case, the cavity has one sidewall. Alternatively, the opening can be a square, rectangle or other similar cross-sectional shape, in which case the opening will have more than one sidewall.

One technique to effect the etch of the lower electrode is to fill the window 101 with a suitable photoresist (PR) after the deposition of the lower electrode layer. Thereafter, a blanket photoresist removal or etchback is carried out. This photoresist removal is done by conventional techniques, for example plasma removal of the photoresist. The removal of the photoresist in the blanket etchback stops on the surface of the lower electrode layer. Thereafter, the photoresist etch step is continued to etchback approximately 100 nm of photoresist into the cavity or window 101. After the photoresist is etched back, an etch step is performed to remove the photoresist from the surface 203 and, in the exemplary embodiment, approximately 100 nm of the electrode 102 from the sidewall(s) of the window or cavity 101. Alternatively, a physical sputtering etch can be used to remove the lower electrode from the top surface 203 and, in the exemplary embodiment of FIG. 2, from a portion of the sidewalls of the cavity 201. This sputter etching is effected preferably with a plasma in which the physical sputter component is dominant over the chemical etching. The physical sputter component could be provided by a noble gas such as Ar, and the chemical component could be an etchant such as Cl. By introducing a mixture of the two gaseous components into the plasma the ratio of physical sputtering to chemical reactivity, as well as the particular mixture of the gases would depend upon the type of plasma used (e.g., high density plasma or parallel plate etcher), the pressure, flow rates and power can be controlled. The parameters, materials and their values are as would be evident to one skilled in the art of plasma etching. The use of the physical sputtering etch tends to round the corners of the titanium nitride removed from inside the top edges of the window or opening 101 (see FIG. 3). It is of interest to note that the aspect ratio of the window plays facilitates the etching of the layer of lower plate or electrode 102. In particular, the aspect ratio will allow the etching of the plate substantially in the X-Z plane as shown in FIG. 4. The depth shown generally as "a" is on the order of 1 micron, whereas the diameter, shown as "b", is on the order of 0.2–0.3 microns.

After either of the above discussed preferred etching techniques to remove the desired portion of the lower electrode is carried out, the deposition of a suitable layer of dielectric material for the capacitor is carried out by standard technique, for example chemical vapor deposition. Preferably, $Ta_2O_5$ is used as the dielectric material of the capacitor. This layer of dielectric is shown generally at 405 in FIG. 4. Thereafter, by standard techniques the upper conductor 406 is deposited. While tantalum pentoxide is the preferred material for the dielectric of the capacitor, other materials to include titanium nitride, silicon oxide, barium strontium titanate or lead zirconium titanate can also be used as the dielectric. Finally, it is of interest to note that while upper electrode is shown as a single layer, multi-layer conductors can be employed. Materials such as tantalum nitride, tungsten nitride, tungsten, platinum, ruthenium or aluminum or combinations thereof can also be used.

The structure shown generally in FIG. 4 is the resultant capacitor structure. As mentioned above, the relatively high aspect ratio of the window or cavity 101 plays an important role in the fabrication of the capacitor. To this end, the relatively high aspect ratio enables the etching of the titanium nitride layer 102 from the top surface of the dielectric layer 203 and, in exemplary embodiment, from a portion of the sidewalls of the opening. That is, the physical etching techniques as used in the invention of the present disclosure enable the removal of the titanium nitride layer 102 from surfaces in the X-Z plane as shown by the coordinate axes of FIG. 4. Accordingly, the isotropic removal of titanium nitride from the top surface 203 and from a portion of the sidewalls of the opening is facilitated by the physical etch techniques described above. The removal of the material from a portion of the sidewalls and lower surface 408 occurs only in the X-Z plane and, accordingly, the titanium nitride layer remains along a significant portion of the sidewalls of the cavity and a significant portion of the lower surface of the cavity. Of course, it is of interest to note that if an over etch of the titanium nitride occurs at the lower surface 408, this is acceptable, as the lower surface of the cavity can be in electrical contact with the tungsten plug 409 (for example) interconnecting to the device in a lower level, not shown.

Figure 6:
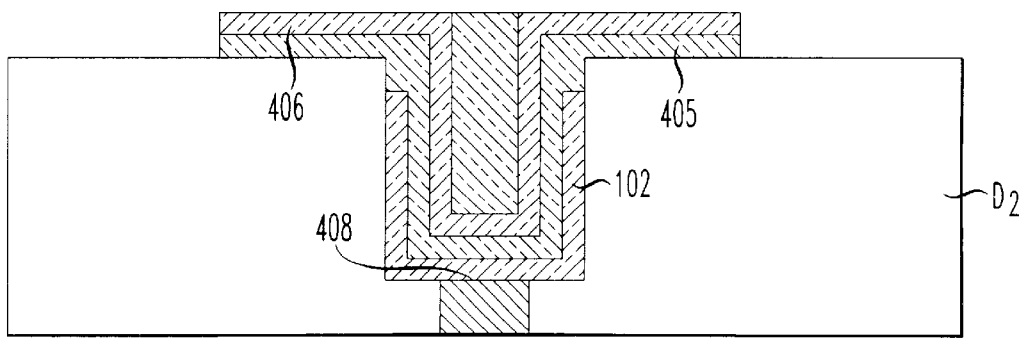
FIG. 6 shows the exemplary capacitor structure of the invention of the present disclosure after chemical mechanical polishing is used as a planarization step.
Figure 7:
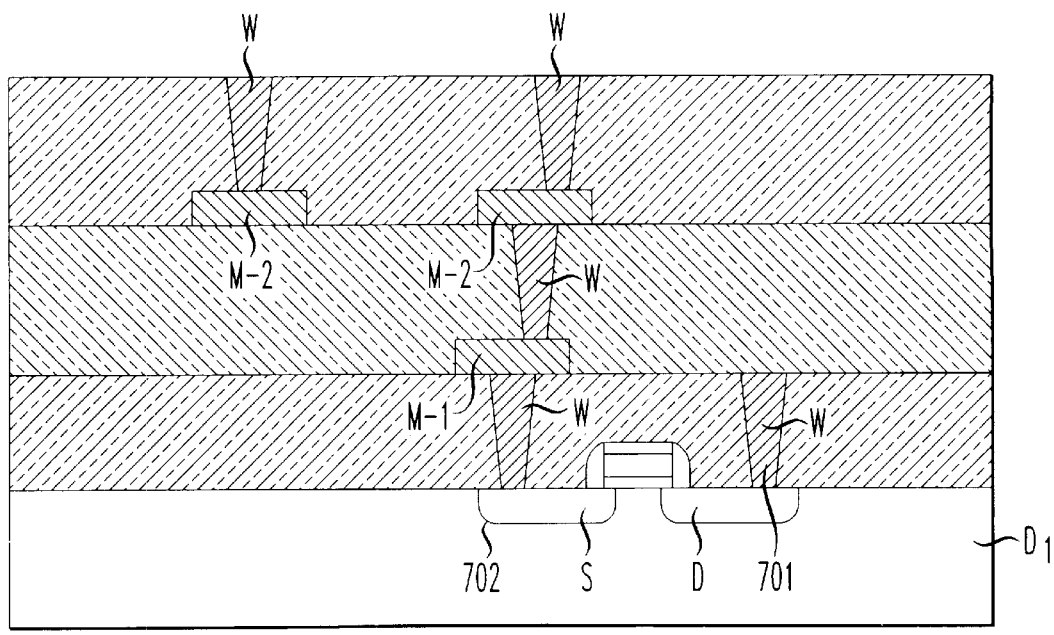
FIG. 7 is a prior art multi-layer integrated circuit (IC) structure.

After the formation of the capacitor, a layer of suitable conductor, preferably tungsten is back filled as shown at 507. The backfill of tungsten is done simultaneously to the filling of the logic portion of the circuit and can therefore comprises an initial deposition of typically Ti followed by TiN then chemical vapor deposition of tungsten. The top electrode of TiN or TaN on the oxide layer serves the additional purpose of protecting the oxide layer from titanium which would reduce the oxide layer and degrade the dielectric properties. This layer is thereafter chemically mechanically polished for purposes of planarization in multi-layer structures, as discussed above. The resultant structure is shown in FIG. 6. By virtue of the removal of a portion of the lower electrode 102 from the top surface of the dielectric a major advantage is achieved by the invention of the present disclosure. Particularly, the tendency of layers 102 and 406 to short due to planarization step of chemical mechanical polishing is avoided by the physical separation of the two layers.

As discussed previously, the fabrication techniques of the present invention are compatible with many ULSI structures, materials and processing. In addition to CMP, the dielectric material used in the capacitor structure of the invention disclosure is also compatible with standard VLSI and ULSI structures and processes. The formation of the capacitors shown in FIG. 6 uses tantalum pentoxide, for example as the high dielectric constant (high k) material. The use of a metal-compatible material such as tantalum pentoxide is of particular interest, as the deposition technique used in its fabrication is a low temperature deposition, on the order of 500° C. or less. Accordingly, this is advantageous by virtue of its compatibility with its embedded technologies for the reasons set forth above.

The invention having been described in detail, it is clear that while the preferred processing steps and materials have been disclosed, alternative processes and materials in the purview of one of ordinary skill in the art can be employed. To the extent that these alternative processes and materials result in an improved capacitor structure and the method of its fabrication, such are deemed within the scope of the present invention.

What is claimed is:

1. An integrated circuit, comprising:
    a layer having a top surface and an opening formed therein, said opening having a high aspect ratio;
    a lower electrode disposed partially on a surface of said opening such that top ends of said lower electrode are disposed at a depth below said top surface, wherein said lower electrode does not include polysilicon;
    a layer of dielectric material that is susceptible to reduction by polysilicon disposed on said lower electrode; and
    an upper electrode disposed on said layer of dielectric material.

2. An integrated circuit as recited in claim 1, wherein said layer of dielectric material extends onto said top surface of said layer.

3. An integrated circuit as recited in claim 1, wherein said lower electrode is in contact with a conductive plug.

4. An integrated circuit as recited in claim 1, wherein said layer of dielectric material is selected from a group consisting of tantalum oxide, titanium nitride, barium strontium titanate and lead zirconium titanate.

5. An integrated circuit as recited in claim 1, wherein said opening has a depth on the order of 1 micron, and a diameter on the order of 0.2 microns.

6. An integrated circuit as recited in claim 1, wherein a layer of metal is disposed on said upper electrode.

7. An integrated circuit as recited in claim 1, wherein said depth is about 0.2 microns.

* * * * *